United States Patent
Iwamoto

(10) Patent No.: US 11,395,398 B2
(45) Date of Patent: Jul. 19, 2022

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Fumio Iwamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/465,595

(22) Filed: Sep. 2, 2021

(65) Prior Publication Data

US 2022/0110204 A1    Apr. 7, 2022

(30) Foreign Application Priority Data

Oct. 1, 2020 (JP) .............................. JP2020-166890

(51) Int. Cl.
*H05G 2/00*       (2006.01)
*G03F 7/20*       (2006.01)

(52) U.S. Cl.
CPC ......... *H05G 2/006* (2013.01); *G03F 7/70033* (2013.01); *G03F 7/7055* (2013.01); *H05G 2/008* (2013.01)

(58) Field of Classification Search
None
See application file for complete search history.

(56) References Cited

U.S. PATENT DOCUMENTS

| 8,598,551 | B2 | 12/2013 | Mestrom et al. | |
| 2016/0227638 | A1* | 8/2016 | Hori | H05G 2/008 |
| 2018/0288863 | A1* | 10/2018 | Fujimaki | H05G 2/008 |
| 2019/0289705 | A1 | 9/2019 | Ishihara et al. | |

FOREIGN PATENT DOCUMENTS

| CN | 102696283 B * | 7/2015 | ............. H05G 2/001 |
| WO | 2017130443 A1 | 8/2017 | |
| WO | 2018/138918 A1 | 8/2018 | |
| WO | 2019/137846 A1 | 7/2019 | |

* cited by examiner

*Primary Examiner* — Michelle M Iacoletti
(74) *Attorney, Agent, or Firm* — Studebaker & Brackett PC

(57) ABSTRACT

An extreme ultraviolet light generation apparatus may include a chamber; a droplet generator configured to sequentially supply a first droplet of target substance to a plasma generation region in the chamber; and a gas flow generation device having a gas outlet for causing gas to flow along a travel direction of the first droplet around at least a part of a trajectory of the first droplet. Here, the droplet generator includes a vibrating element configured to generate, by applying vibration to a nozzle through which the target substance is output, a plurality of second droplets each having smaller volume than the first droplet and to cause the second droplets to be combined to generate the first droplet, and the gas outlet is located downstream, on a trajectory direction of the first droplet, of a position where the second droplets are combined and the first droplet is generated.

16 Claims, 20 Drawing Sheets

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2020-166890, filed on Oct. 1, 2020, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. Pat. No. 8,598,551
Patent Document 2: International Publication No. WO2019/137846
Patent Document 3: International Publication No. WO2018/138918
Patent Document 4: International Publication No. WO2017/130443

SUMMARY

An extreme ultraviolet light generation apparatus according to an aspect of the present disclosure includes a chamber configured to generate plasma therein; a droplet generator configured to contain a target substance and to sequentially supply a first droplet of target substance to a plasma generation region in the chamber; and a gas flow generation device having a gas outlet for causing gas to flow along a travel direction of the first droplet around at least a part of a trajectory of the first droplet. Here, the droplet generator includes a vibrating element configured to generate, by applying vibration to a nozzle through which the target substance is output, a plurality of second droplets each having smaller volume than the first droplet and to cause the second droplets to be combined to generate the first droplet, and the gas outlet is located downstream, on a trajectory direction of the first droplet, of a position where the second droplets are combined and the first droplet is generated.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber configured to generate plasma therein; a droplet generator configured to contain a target substance and to sequentially supply a first droplet of target substance to a plasma generation region in the chamber; and a gas flow generation device having a gas outlet for causing gas to flow along a travel direction of the first droplet around at least a part of a trajectory of the first droplet. Further, the droplet generator includes a vibrating element configured to generate, by applying vibration to a nozzle through which the target substance is output, a plurality of second droplets each having smaller volume than the first droplet and to cause the second droplets to be combined to generate the first droplet, and the gas outlet is located downstream, on a trajectory direction of the first droplet, of a position where the second droplets are combined and the first droplet is generated.

BRIEF DESCRIPTION OF THE DRAWINGS

Embodiments of the present disclosure will be described below merely as examples with reference to the accompanying drawings.

DESCRIPTION OF EMBODIMENTS

Figure 1:
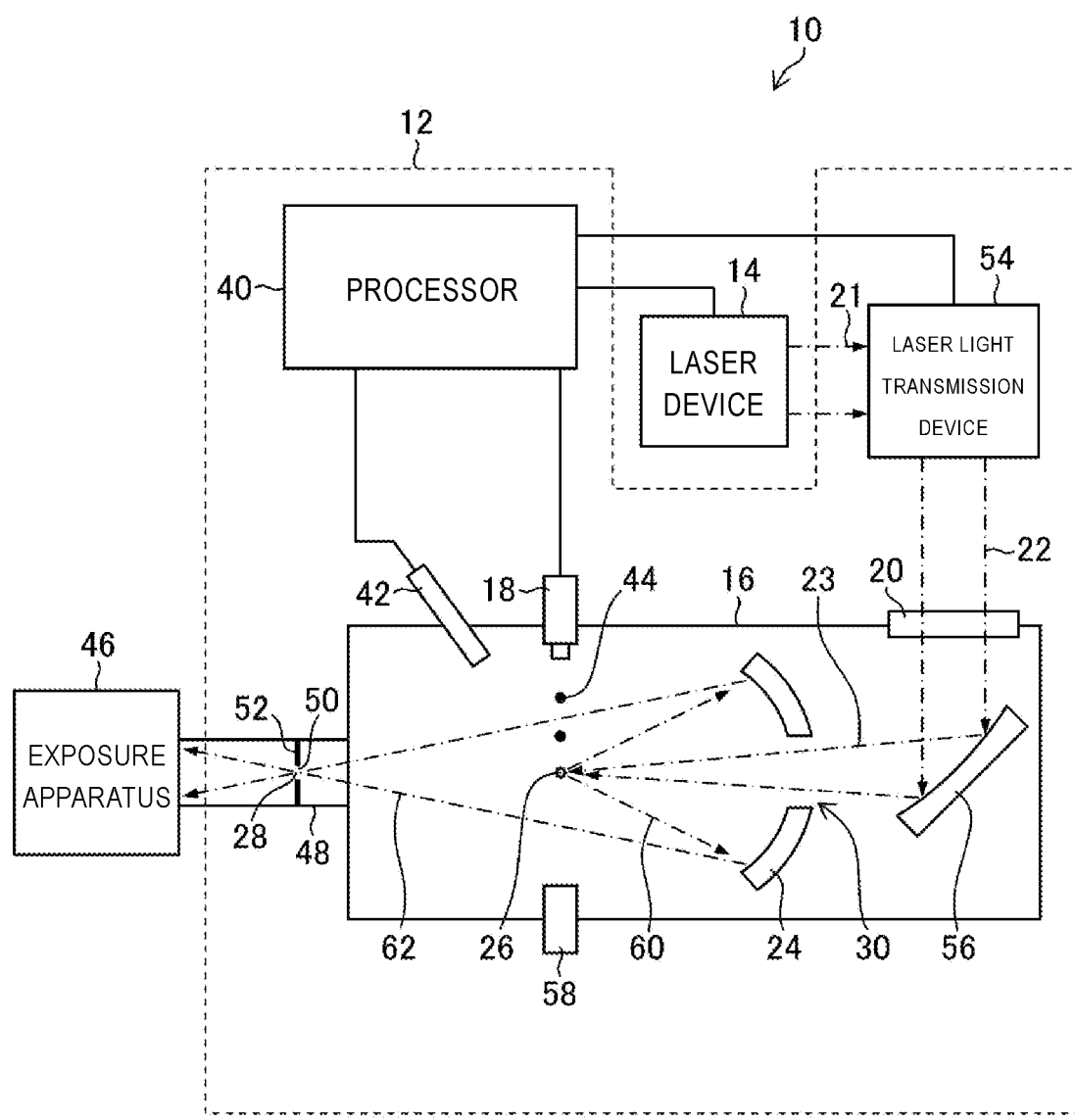
FIG. 1 schematically shows the configuration of an LPP EUV light generation system.

<Contents>
1. Description of terms
2. Overall description of EUV light generation system
   2.1 Configuration
   2.2 Operation
3. Explanation of EUV light generation apparatus according to comparative example
   3.1 Configuration
   3.2 Operation
   3.3 Droplet generation
   3.4 Problem
4. First Embodiment
   4.1 Configuration
   4.2 Operation
   4.3 Effect
5. Second Embodiment
   5.1 Configuration
   5.2 Operation
   5.3 Effect
6. Third Embodiment
   6.1 Configuration
   6.2 Operation
   6.3 Effect
7. Fourth Embodiment
   7.1 Configuration
   7.2 Operation
   7.3 Effect
   7.4 Modified example
8. Example of electronic device manufacturing method
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Description of Terms

"Pulse laser light" may mean laser light including a plurality of pulses.

"Laser light" may mean not only pulse laser light but also laser light in general.

A "laser light path" means an optical path of laser light.

A "target" is an object to be irradiated with laser light introduced into a chamber. The target irradiated with laser light is turned into plasma and emits EUV light. The target serves as a plasma generation source.

A "droplet" is a form of a target supplied into the chamber. A droplet is synonymous with a droplet-like target. A droplet may mean a target having a substantially spherical shape due to surface tension of a melted target substance.

A "trajectory of a droplet" means a path along which a droplet travels. The trajectory of a droplet may be referred to as a "droplet trajectory" or simply as a "trajectory."

A "trajectory direction of a droplet" means a direction parallel to a travel direction of a droplet. With respect to the trajectory direction of a droplet, the generation source side of a droplet is referred to as "upstream", and the arrival point side of a droplet is referred to as "downstream." The expressions "upstream side" and "downstream side" may be used for the relative positional relationship of a droplet in the trajectory direction.

"Plasma light" is radiation light radiated from a target turned into plasma. The radiation light includes EUV light.

The expression "EUV light" is an abbreviation for "extreme ultraviolet light."

A "piezoelectric element" is synonymous with a piezoelectric device. The piezoelectric element is a form of a "vibrating element." The piezoelectric element may simply be referred to as a "piezo" or "PZT."

2. Overall Description of EUV Light Generation System

2.1 Configuration

FIG. 1 schematically shows the configuration of an LPP EUV light generation system 10. An EUV light generation apparatus 12 is used with a laser device 14. In the present disclosure, a system including the EUV light generation apparatus 12 and the laser device 14 is referred to as the EUV light generation system 10. The EUV light generation apparatus 12 includes a chamber 16 and a target supply unit 18.

The chamber 16 is a sealable container. The target supply unit 18 supplies a target substance into the chamber 16. The material of the target substance may include tin, terbium, gadolinium, lithium, xenon, or a combination of any two or more thereof.

A through hole is formed in a wall of the chamber 16. The through hole is blocked by a window 20 through which pulse laser light 22 emitted from the laser device 14 passes. An EUV light concentrating mirror 24 having a spheroidal reflection surface is arranged in the chamber 16. The EUV light concentrating mirror 24 has a first focal point and a second focal point. A multilayer reflection film in which molybdenum and silicon are alternately stacked is formed on a surface of the EUV light concentrating mirror 24. The EUV light concentrating mirror 24 may be disposed so that the first focal point is located in a plasma generation region 26 and the second focal point is located at an intermediate focal point 28. A through hole 30 is formed at the center of the EUV light concentrating mirror 24, and pulse laser light 23 passes through the through hole 30.

The EUV light generation apparatus 12 includes a processor 40, a target sensor 42, and the like. The target sensor 42 detects at least one of the presence, trajectory, position, and velocity of the target 44. The target sensor 42 may have an imaging function.

Further, the EUV light generation apparatus 12 includes a connection portion 48 providing communication between an internal space of the chamber 16 and an internal space of an exposure apparatus 46. A wall 52 in which an aperture 50 is formed is provided in the connection portion 48. The wall 52 is arranged so that the aperture 50 is located at the second focal point of the EUV light concentrating mirror 24.

Furthermore, the EUV light generation apparatus 12 includes a laser light transmission device 54, a laser light concentrating mirror 56, a target collection unit 58 for collecting the target 44, and the like. The laser light transmission device 54 includes an optical element for defining a transmission state of laser light, and an actuator for adjusting the position, posture, and the like of the optical element.

2.2 Operation

Operation of the LPP EUV light generation system 10 will be described with reference to FIG. 1. Pulse laser light 21 emitted from the laser device 14 enters, via the laser light transmission device 54, the chamber 16 through the window 20 as the pulse laser light 22. The pulse laser light 22 travels along a laser light path in the chamber 16, is reflected by the laser light concentrating mirror 56, and is radiated to the target 44 as the pulse laser light 23.

The target supply unit 18 outputs the target 44 formed of a target substance toward the plasma generation region 26 in the chamber 16. The target 44 is irradiated with the pulse laser light 23. The target 44 irradiated with the pulse laser light 23 is turned into plasma, and radiation light 60 is radiated from the plasma. EUV light 62 contained in the radiation light 60 is selectively reflected by the EUV light concentrating mirror 24. The EUV light 62 reflected by the EUV light concentrating mirror 24 is concentrated at the intermediate focal point 28 and output to the exposure apparatus 46. Here, one target 44 may be irradiated with a plurality of pulses included in the pulse laser light 23.

The processor 40 controls the entire EUV light generation system 10. The processor 40 processes a detection result of the target sensor 42. Based on the detection result of the target sensor 42, the processor 40 may control timing at which the target 44 is output, an output direction of the target 44, and the like. Further, the processor 40 may control oscillation timing of the laser device 14, the travel direction of the pulse laser light 22, concentration position of the pulse laser light 23, and the like. The above-described various controls are merely examples, and other controls may be added as necessary.

The processor of the present disclosure is a processing device including a storage device in which a control program is stored and a central processing unit (CPU) that executes the control program. The processor is specifically configured or programmed to perform various processes included in the present disclosure.

3. Explanation of EUV Light Generation Apparatus According to Comparative Example

3.1 Configuration

Figure 2:
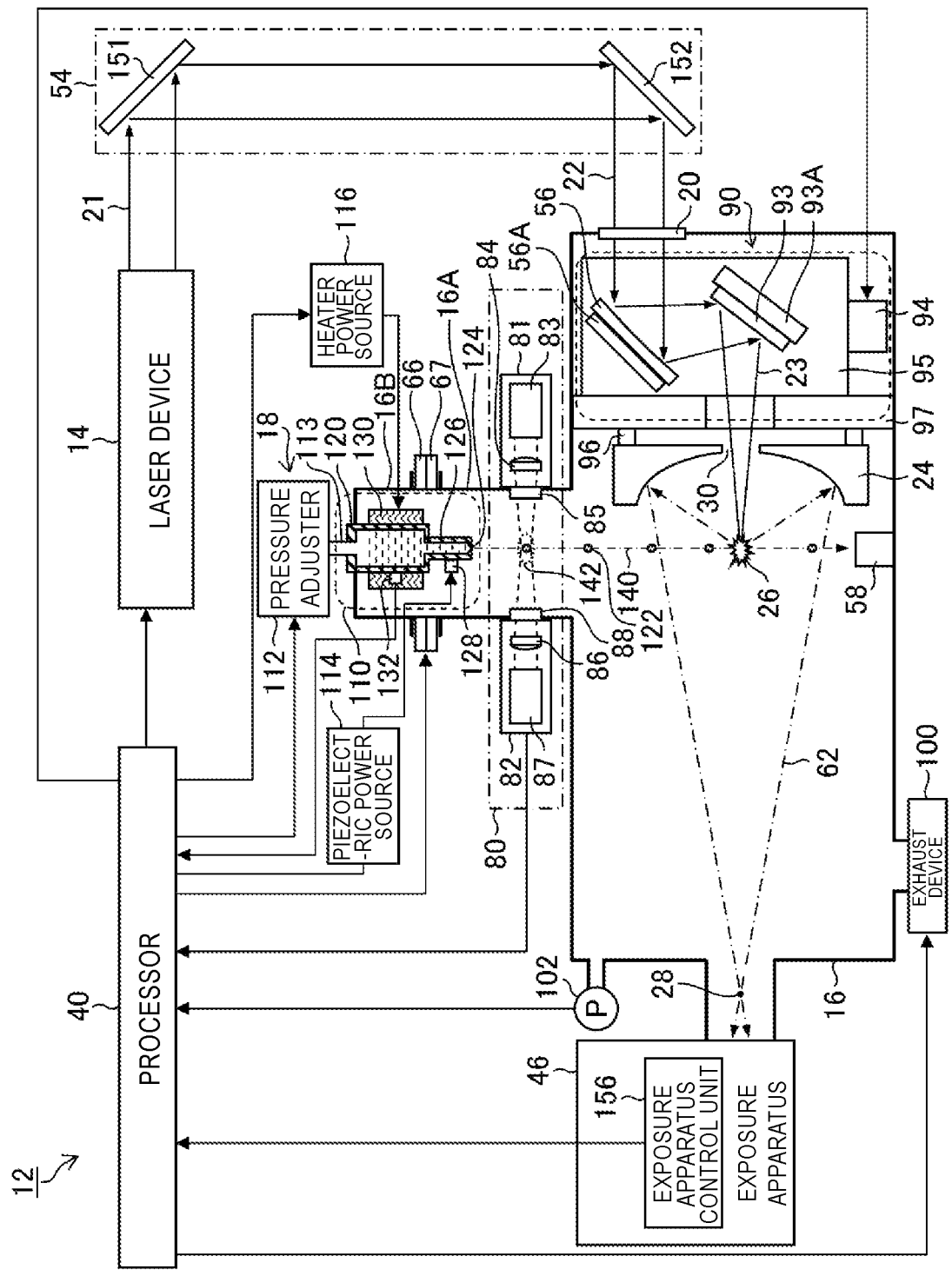
FIG. 2 schematically shows the configuration of an EUV light generation apparatus according to a comparative example.

FIG. 2 schematically shows the configuration of the EUV light generation apparatus 12 according to a comparative example. The comparative example of the present disclosure is an example recognized by the applicant as known only by the applicant, and is not a publicly known example admitted by the applicant.

Figure 3:
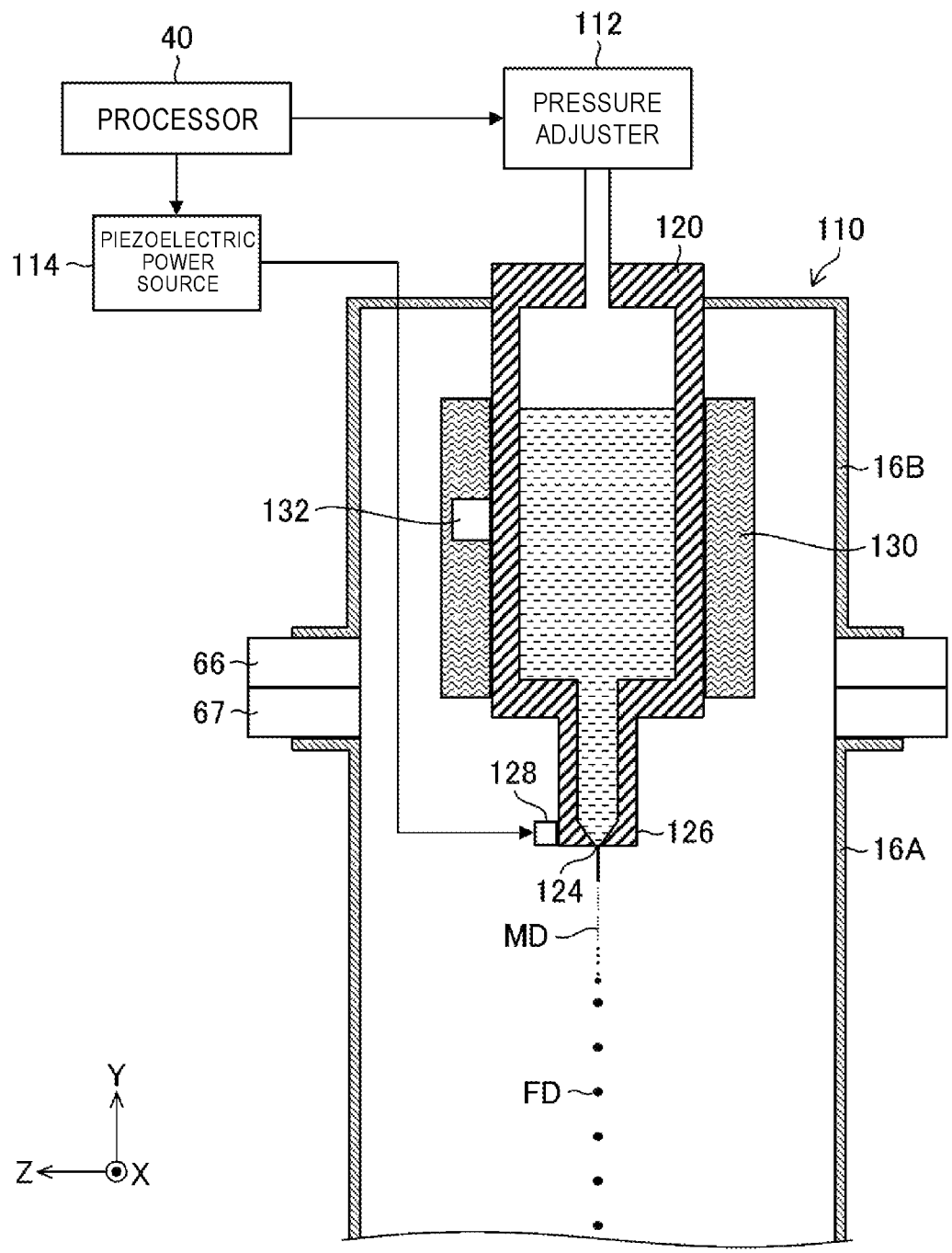
FIG. 3 schematically shows the configuration in the vicinity of a droplet generator in the EUV light generation apparatus according to the comparative example.

In FIG. 2, XYZ orthogonal coordinate axes are introduced for convenience of explanation regarding directions. The direction in which the EUV light 62 is output from the chamber 16 toward the exposure apparatus 46 is defined as a Z-axis direction. The X axis and the Y axis are perpendicular to the Z axis and are perpendicular to each other. The center axis direction of a nozzle 126 for outputting the target substance is defined as a Y-axis direction. The Y-axis direction is the trajectory direction of the droplet 122. A direction perpendicular to the paper surface of FIG. 2 is defined as an X-axis direction. In FIG. 3 and subsequent drawings, the same coordinate axes as those introduced in FIG. 2 are used.

The EUV light generation apparatus 12 includes the chamber 16, the laser light transmission device 54, and the processor 40. The chamber 16 includes the target supply unit 18, a stage 66, a timing sensor 80, the window 20, a laser light concentrating optical system 90, the EUV light concentrating mirror 24, the target collection unit 58, an exhaust device 100, and a pressure sensor 102.

The target supply unit 18 includes a droplet generator 110, a pressure adjuster 112, a piezoelectric power source 114, and a heater power source 116. The pressure adjuster 112, the piezoelectric power source 114, and the heater power source 116 are connected to the processor 40, respectively.

The droplet generator 110 includes a tank 120 for storing the target substance, the nozzle 126 including a nozzle hole 124 for outputting the target substance, and a piezoelectric element 128 arranged in the vicinity of the nozzle 126. The droplet generator 110 also includes a heater 130 and a temperature sensor 132. The heater 130 and the temperature sensor 132 are arranged on the outer side surface of the tank 120.

The temperature sensor 132 is connected to the processor 40. The piezoelectric power source 114 is connected to the piezoelectric element 128. The heater power source 116 is connected to the heater 130.

The target substance may be, for example, tin. The inside of the tank 120 is made of a material that is less likely to react with the target substance. For example, Mo, W, Ta, $Al_2O_3$, SiC, $SiO_2$, or the like can be used as the material that is less likely to react with tin, which is an example of the target substance.

The pressure adjuster 112 is connected to the tank 120 through a pipe line 113. The pressure adjuster 112 is arranged at a pipe between an inert gas supply unit (not shown) and the tank 120. The inert gas supply unit may include a gas cylinder filled with inert gas such as helium or argon. The inert gas supply unit can supply the inert gas into the tank 120 through the pressure adjuster 112. The pressure adjuster 112 may be connected to an exhaust pump (not shown). The pressure adjuster 112 includes a solenoid valve (not shown) for supplying and exhausting of gas, a pressure sensor (not shown), and the like. The pressure adjuster 112 can detect the pressure in the tank 120 using the pressure sensor. The pressure adjuster 112 can operate the exhaust pump to exhaust the gas in the tank 120.

The pressure adjuster 112 outputs a detection signal of the detected pressure to the processor 40. The processor 40 supplies, to the pressure adjuster 112, a control signal for controlling the operation of the pressure adjuster 112 based on the detection signal output from the pressure adjuster 112 so that the pressure in the tank 120 becomes a target pressure.

The stage 66 can move the droplet generator 110 to at least a specified position in the X-Z plane based on a command from the processor 40. The stage 66 is an example of the "first stage" in the present disclosure.

The chamber 16 includes a first container 16A and a second container 16B. The second container 16B is a container communicating with the first container 16A and is connected to the first container 16A through the stage 66 and a support plate 67. The second container 16B is fixed to the stage 66.

The droplet generator 110 is fixed to the second container 16B. That is, the droplet generator 110 is fixed to the stage 66 through the second container 16B.

The support plate 67 is fixed to the first container 16A. The stage 66 is configured to be movable on the support plate 67 at least in the X-Z plane. The first container 16A to which the support plate 67 is fixed is a fixed container fixedly installed at a predetermined position. The second container 16B fixed to the stage 66 is a movable container movable on the support plate 67. Movement of the stage 66 on the support plate 67 allows the droplet generator 110 to be moved to a position specified by the processor 40.

The timing sensor 80 includes a light source unit 81 and a light receiving unit 82. The light source unit 81 and the light receiving unit 82 are arranged so as to face each other across a droplet trajectory 140 which is the travel path of the droplet 122.

The light source unit 81 includes a light source 83 and an illumination optical system 84. The light source unit 81 is arranged so as to illuminate the droplet 122 in the detection region 142 on the droplet trajectory 140 between the nozzle hole 124 of the droplet generator 110 and the plasma generation region 26. The light source 83 may be a monochromatic laser light source or a lamp emitting a plurality of wavelengths. The light source 83 may also include an optical fiber, which is connected to the illumination optical system 84. The illumination optical system 84 includes a condenser lens. The illumination optical system 84 may include a window 85. The window 85 is arranged in the wall of the chamber 16.

The light receiving unit 82 of the timing sensor 80 includes a light receiving optical system 86 and an optical sensor 87. The light receiving unit 82 is disposed so as to receive illumination light that is at least a part of the illumination light output from the light source unit 81 and has passed through the detection region 142. The light receiving optical system 86 includes a light concentrating lens. The light receiving optical system 86 may include a window 88. The window 88 is arranged in the wall of the chamber 16.

The optical sensor 87 includes one or more light receiving surfaces. The optical sensor 87 can be configured by any of a photodiode, a photodiode array, an avalanche photodiode, a photomultiplier tube, a multi-pixel photon counter, and an image intensifier. The optical sensor 87 outputs an electric signal corresponding to the amount of received light.

The window 85 of the light source unit 81 and the window 88 of the light receiving unit 82 are arranged at positions facing each other across the droplet trajectory 140. The facing direction of the light source unit 81 and the light receiving unit 82 may be perpendicular to the droplet trajectory 140 or may be non-perpendicular to the droplet trajectory 140. The timing sensor 80 is an example of the target sensor 42 shown in FIG. 1.

The laser light transmission device 54 shown in FIG. 2 includes a first high-reflection mirror 151 and a second high-reflection mirror 152 as optical elements for defining the travel direction of the laser light.

The laser light concentrating optical system 90 is arranged so that the pulse laser light 22 output from the laser light transmission device 54 is input. The laser light concentrating optical system 90 is configured to concentrate laser light entering the chamber 16 through the window 20 on the plasma generation region 26. The laser light concentrating optical system 90 includes a laser light concentrating mirror 56, a high-reflection planar mirror 93, and a laser light manipulator 94.

The laser light concentrating mirror 56 may be, for example, a high-reflection off-axis parabolic mirror. The laser light concentrating mirror 56 is held by a mirror holder 56A. The mirror holder 56A is fixed to a plate 95. The high-reflection planar mirror 93 is held by a mirror holder 93A. The mirror holder 93A is fixed to the plate 95.

The laser light manipulator 94 is configured using, for example, a stage capable of moving the plate 95 in mutually orthogonal directions of three axes of the X axis, the Y axis, and the Z axis. The laser light manipulator 94 is configured to be capable of moving the laser radiation position within the chamber 16 in the directions of the respective axes of the X axis, the Y axis, and the Z axis to a position specified by the processor 40.

The EUV light concentrating mirror 24 is held by the EUV light concentrating mirror holder 96. The EUV light concentrating mirror holder 96 is fixed to the plate 97. The plate 97 is a member for holding the laser light concentrating optical system 90 and the EUV light concentrating mirror 24. The plate 97 is fixed to the inner wall of the chamber 16.

The processor 40 is connected to each of the laser device 14, the target supply unit 18, the stage 66, the timing sensor 80, and the laser light manipulator 94. Further, the processor 40 is connected to the exhaust device 100, the pressure sensor 102, and an exposure apparatus control unit 156. The exposure apparatus control unit 156 is a control unit for controlling the exposure apparatus 46. The exposure apparatus control unit 156 may be included in the exposure apparatus 46.

3.2 Operation

The processor 40 controls the exhaust device 100 to exhaust the gas in the chamber 16 to a predetermined pressure or lower. The predetermined pressure may be, for example, 1 Pa. In addition, the processor 40 performs control of heating and maintaining the target substance in the tank 120 at a predetermined temperature equal to or higher than the melting point while driving the heater 130 through the heater power source 116 and monitoring the temperature by the temperature sensor 132 after exhausting the gas in the chamber 16 to the predetermined pressure or lower. When the target substance is tin, the melting point of tin is 232° C., so that the predetermined temperature may be, for example, a temperature ranging from 250° C. to 290° C. The target substance contained in the tank 120 is melted into liquid by heating using the heater 130.

The processor 40 controls the pressure adjuster 112 so that the pressure in the tank 120 becomes the predetermined pressure to discharge the liquid target substance from the nozzle hole 124. The predetermined pressure in the tank 120 may be, for example, a pressure equal to or higher than 3 MPa.

The pressure adjuster 112 can increase or decrease the pressure in the tank 120 by supplying gas into the tank 120 or exhausting gas from the tank 120 based on the control signal from the processor 40. The pressure in the tank 120 is adjusted by the pressure adjuster 112 to a target pressure. The gas introduced into the tank 120 is preferably inert gas.

The pressure adjuster 112 adjusts the pressure in the tank 120 to a predetermined value in response to an instruction from the processor 40 so that the droplet 122 reaches the plasma generation region 26 at a predetermined target speed.

The processor 40 performs control for supplying a drive voltage of a predetermined waveform to the piezoelectric element 128 through the piezoelectric power source 114. As a result, the target substance discharged from the nozzle hole 124 is separated into droplets 122 at a predetermined cycle.

The droplet 122 generated by the target supply unit 18 is detected by the timing sensor 80. The timing sensor 80 generates a passage timing signal indicating a passage timing of the droplet 122 based on the detected signal, and transmits the passage timing signal to the processor 40.

The processor 40 may output, to the laser device 14, a light emission trigger signal delayed by a predetermined time with respect to the passage timing signal from the timing sensor 80. When the light emission trigger signal is input to the laser device 14, the laser device 14 outputs the pulse laser light 21. The pulse laser light 21 output from the laser device 14 is input to the laser light concentrating optical system 90 through the laser light transmission device 54 and the window 20.

The processor 40 may control the stage 66 to move the droplet generator 110 such that the droplet 122 passes through the plasma generation region 26.

The processor 40 controls the laser light manipulator 94 such that the pulse laser light 23 is concentrated on the plasma generation region 26. The pulse laser light 23 is concentrated and radiated on the droplet 122 in the plasma generation region 26 by the laser light concentrating optical system 90. Thus, the EUV light 62 is generated by concentrating and radiating the pulse laser light 23 on the droplet 122. The EUV light 62 may be cyclically generated by concentrating and radiating the pulse laser light 23 on the droplets 122 sequentially supplied from the target supply unit 18 to the plasma generation region 26 at a predetermined cycle.

The EUV light 62 generated from the plasma generation region 26 may be concentrated by the EUV light concentrating mirror 24, concentrated at the intermediate focal point 28, and input to the exposure apparatus 46.

The droplet 122 not irradiated with the pulse laser light 23 passes through the plasma generation region 26 and enters the target collection unit 58. The droplet 122 collected by the target collection unit 58 can be stored as a liquid target substance.

3.3 Droplet Generation

FIG. 3 schematically shows the configuration in the vicinity of the droplet generator 110 in the EUV light generation apparatus 12 according to the comparative example. The target substance that emerges from the nozzle hole 124 in a columnar shape is divided into minute droplets MD by the vibration applied to the nozzle 126 and the surface tension of the target substance. The interval $\lambda$ between the minute droplets MD is usually about 3 to 8 times the diameter of the nozzle hole 124. For example, when the diameter of the nozzle hole 124 is 3 μm, the interval $\lambda$ is about 9 to 24 μm. When the flow velocity of the target substance output from the nozzle hole 124 is v, the generation cycle t of the minute droplets MD is expressed by $t=\lambda/v$. For example, when v=100 m/s and $\lambda$=20 μm, t=0.2 μs.

Since the generation cycle t of the minute droplets MD does not necessarily coincide with the cycle of the laser irradiation, in order to make the cycle of the droplets 122 to be subject to laser irradiation coincide with the cycle of the laser irradiation, a plurality of the minute droplets MD are cyclically combined to generate a final droplet FD having a predetermined cycle. For example, when the generation cycle t of the minute droplet MD is 0.2 μs and the cycle of laser irradiation is 10 μs, 50 minute droplets MD are combined to generate the final droplet FD at a cycle of 10 μs. "Minute" of the minute droplet MD means that the volume is smaller than the final droplet FD to be subject to laser irradiation.

For example, when vibration is applied to the nozzle 126 so as to create a velocity difference for a predetermined first cycle in the minute droplets MD using the piezoelectric element 128, combining of the minute droplets MD repeats to finally generate the droplet (final droplet FD) 122 in a predetermined second cycle.

Figure 4:
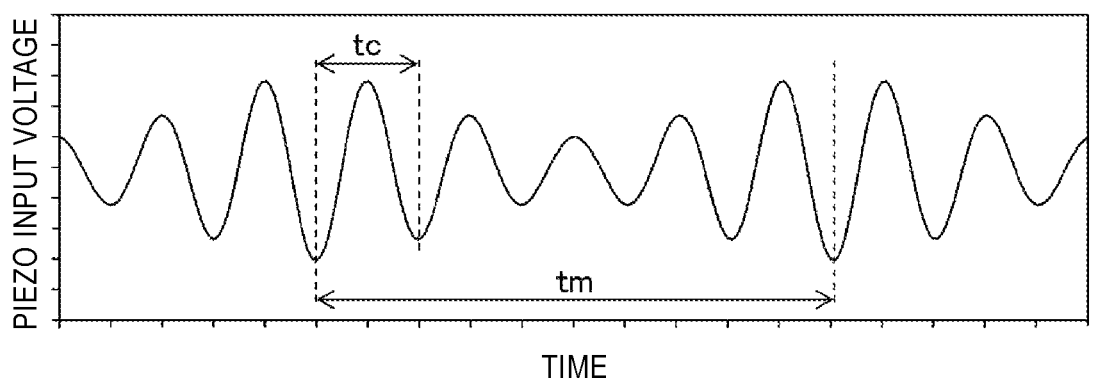
FIG. 4 shows an example of a voltage waveform of an amplitude modulation wave applied to a piezoelectric element.
Figure 5:
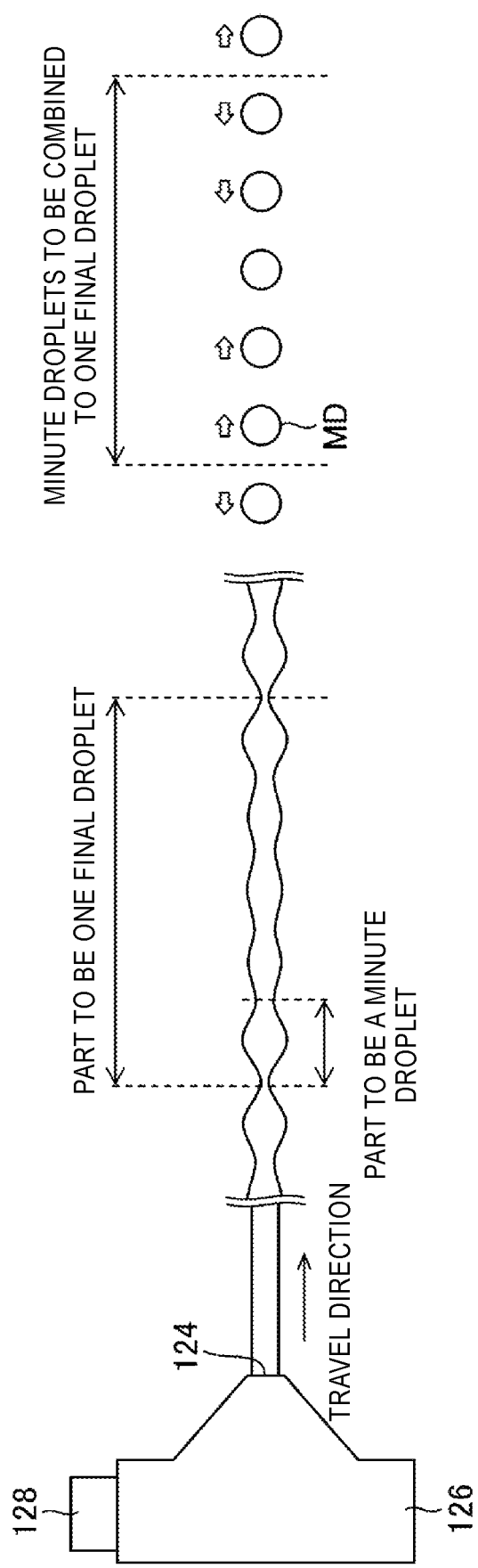
FIG. 5 schematically shows the behavior of a target substance output from a nozzle hole.

As a method to create a velocity difference for the minute droplets MD, the voltage waveform applied to the piezoelectric element 128 may be set to an amplitude modulation wave. FIG. 4 shows an example of the voltage waveform of the amplitude modulation wave applied to the piezoelectric element 128. FIG. 5 schematically shows the behavior of the target substance output from the nozzle hole 124.

When a modulation cycle is tm and a carrier wave cycle is tc, by setting tm to the generation cycle of the final droplet FD and tc to the generation cycle of the minute droplet MD, respectively, the minute droplets MD can be combined to generate the final droplet FD at the predetermined cycle tm.

When the nozzle 126 vibrates with the amplitude-modulated vibration waveform, "constrictions" having different sizes are generated on the surface of the target substance output from the nozzle hole 124 according to the amplitude modulation waveform. The constrictions grow and are eventually divided as the target substance travels, and velocity difference occurs in the minute droplets MD after being divided due to the balance of the size of adjacent constrictions. In FIG. 5, white arrows shown above the minute droplets MD indicate the directions of the relative velocity with respect to the average velocity of the minute droplets MD. In FIG. 5, for simplification of illustration, a state in which five minute droplets MD are to be combined to generate one final droplet FD is shown, but the number of minute droplets MD to be combined as one final droplet FD is not particularly limited. For example, the number of minute droplets MD to be combined to generate the final droplet FD may be 5 or more and 70 or less.

The voltage waveform for driving the piezoelectric element 128 is not limited to the amplitude modulation wave shown in FIG. 4, and may be a frequency modulation wave, a phase modulation wave, or the like. Further, not limited to the modulation wave, the piezoelectric element 128 may be driven by a cyclic wave, such as a rectangular wave, having the same cycle as the generation cycle of the final droplets FD.

Figure 6:
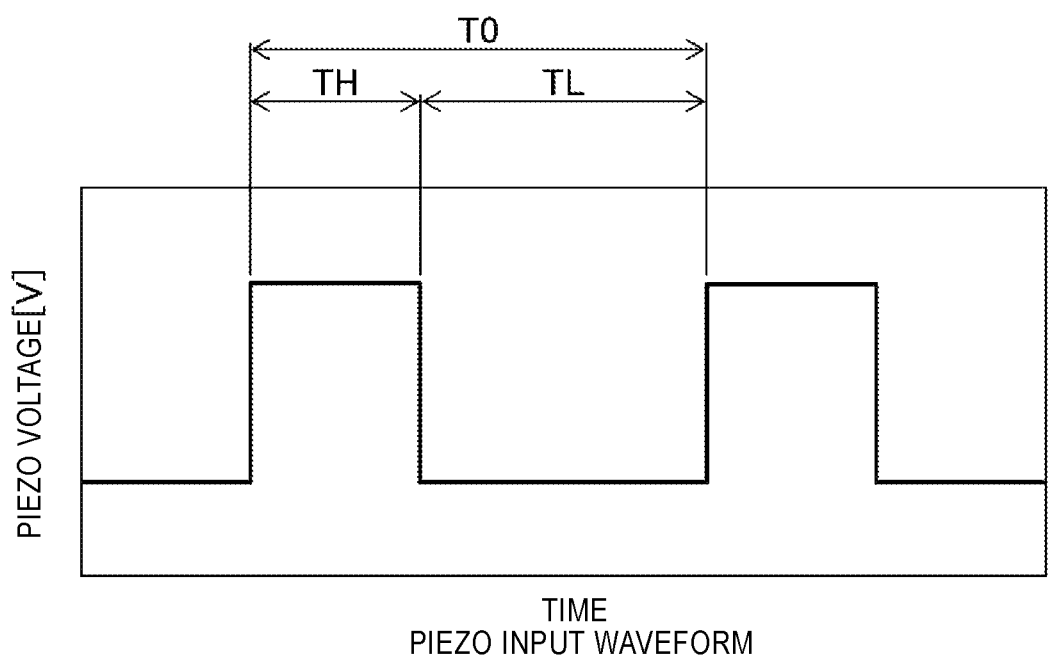
FIG. 6 shows an example of a voltage waveform of a rectangular wave applied to the piezoelectric element.

FIG. 6 shows an example of a voltage waveform of a rectangular wave applied to the piezoelectric element 128. A cycle TO in the rectangular wave includes time TH of a voltage High and time TL of a voltage Low. The duty (Duty) of the rectangular wave as in FIG. 6 is defined by the ratio TH/TO of the time TH of the voltage High to the cycle TO.

When the timing sensor 80 detects an uncombined droplet, the processor 40 controls the voltage waveform applied to the piezoelectric element 128. For example, in the case where the voltage waveform is a rectangular wave, the duty of the rectangular wave is changed so as to set a duty at which an uncombined droplet does not occur.

3.4 Problem

If the distance between adjacent droplets is narrow after the droplets are combined to the final droplet FD, when a droplet is irradiated with laser light, the position of the droplet to be irradiated next moves due to shock wave. In order to avoid this, it is necessary to increase the distance between adjacent droplets.

There is a method of increasing the velocity of the droplets and increasing the distance between the droplets by increasing the pressure applied to the inside of the tank 120 of the droplet generator 110 or by flowing gas in parallel with the droplet trajectory 140 and along the travel direction of the droplets.

Figure 7:
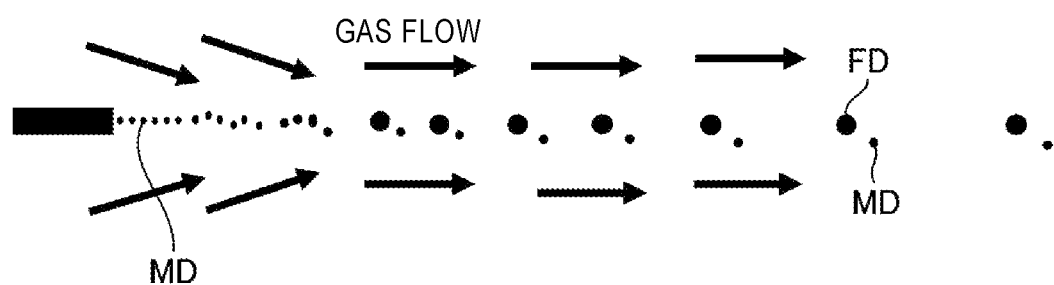
FIG. 7 schematically shows an example of a case of flowing gas in the travel direction of droplets.

FIG. 7 schematically shows an example of a case of flowing gas in the travel direction of the droplets. In the case where the velocity of the droplets is increased by flowing gas, if the gas flow is applied to the minute droplets MD, the velocity and travel direction of the minute droplets MD are disturbed, so that the subsequent process of combining to the final droplet FD becomes unstable, resulting in problems such as occurrence of an uncombined droplet.

The presence of the uncombined minute droplet MD may cause the timing sensor 80 to generate a passage timing signal of the minute droplet MD and to irradiate the minute droplet MD with the pulse laser light. As described above, when the irradiation timing of the pulse laser light is mistaken to irradiate the minute droplet MD with the pulse laser light, the energy of the generated EUV light 62 decreases.

In addition, when the minute droplet MD exists in the vicinity of the final droplet FD, the pulse laser light is incompletely radiated to the final droplet FD and/or the minute droplet MD, and a broken target substance contaminates the inside of the chamber 16.

4. First Embodiment

4.1 Configuration

Figure 8:
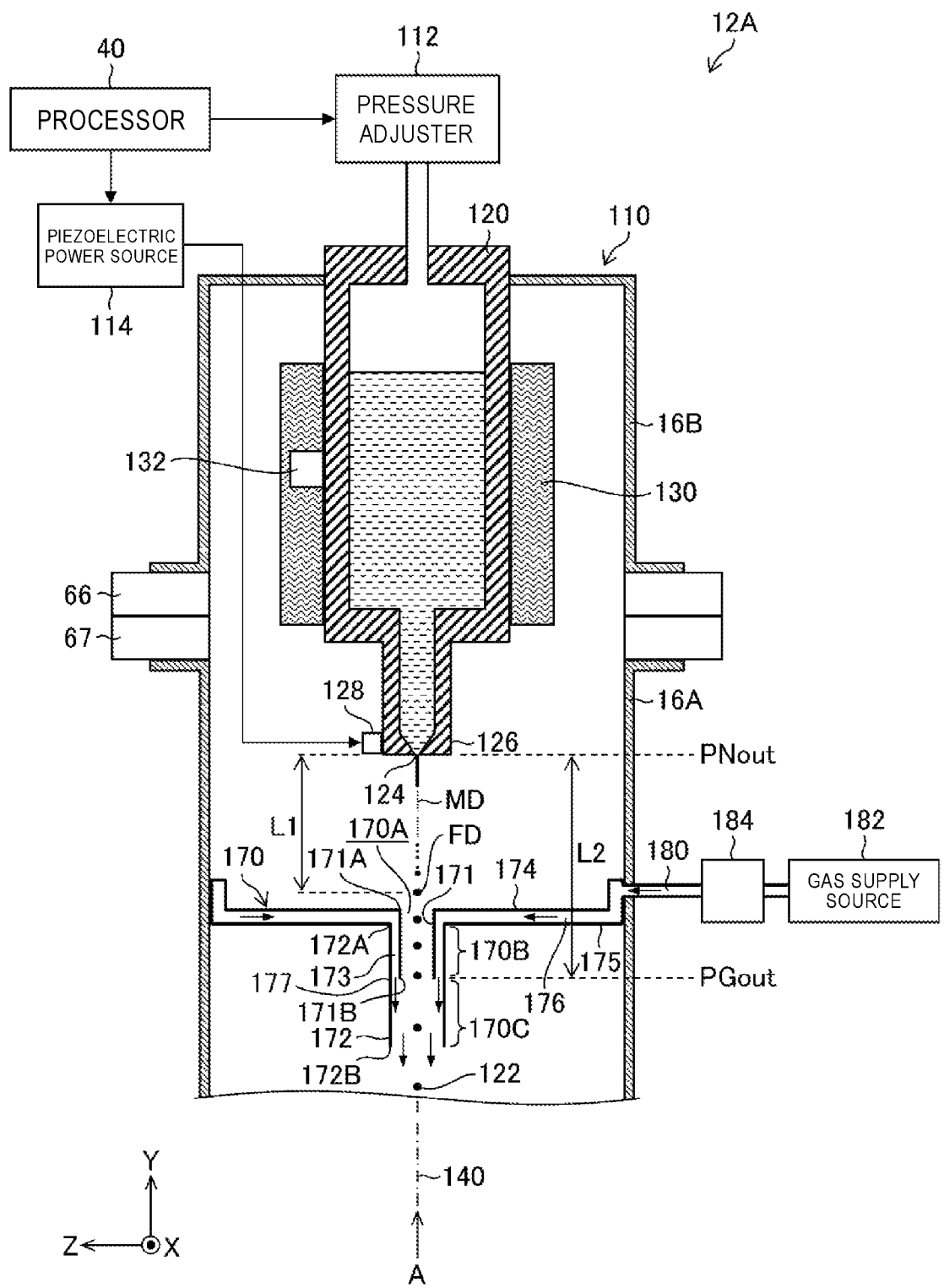
FIG. 8 schematically shows the configuration in the vicinity of the droplet generator in the EUV light generation apparatus according to a first embodiment.
Figure 9:
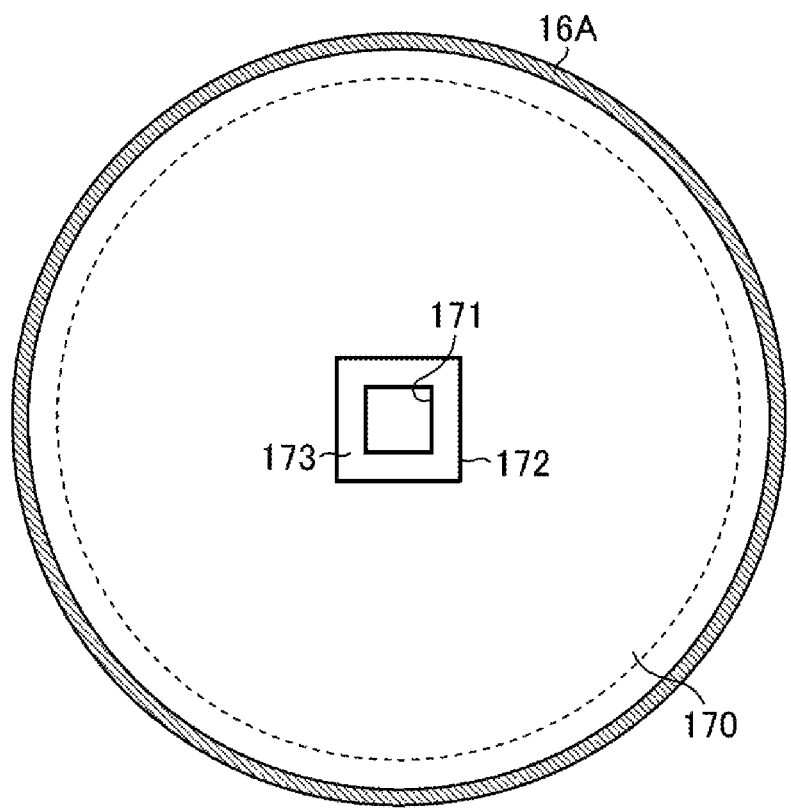
FIG. 9 is a view viewed in the direction of arrow A in FIG. 8.

FIG. 8 is a sectional view schematically showing the configuration in the vicinity of the droplet generator 110 in the EUV light generation apparatus 12A according to a first embodiment. FIG. 9 is a view viewed in the direction of arrow A in FIG. 8. The configuration shown in FIGS. 8 and 9 will be described in terms of differences from the configuration shown in FIG. 1.

In the EUV light generation apparatus 12A according to the first embodiment, a gas introduction member 170 is arranged on the droplet trajectory 140 from the droplet generator 110 to the plasma generation region 26. The gas introduction member 170 is fixed to the inner wall of the chamber 16. The gas introduction member 170 of the present embodiment is fixed to the inner wall of the cylindrical first container 16A along the droplet trajectory 140.

The gas introduction member 170 includes an opening 170A through which the droplet passes. The opening area of the opening 170A may be determined to have an appropriate size based on the variation in the droplet trajectory 140 and the moving range of the stage 66.

The opening 170A is configured by a pipe structure that covers the periphery of at least a part of the droplet trajectory 140. The upstream part of the pipe structure forming the opening 170A includes a double pipe portion 170B having a double pipe structure, and the downstream part thereof includes a single pipe portion 170C having a single pipe structure. That is, the gas introduction member 170 is configured to include a first pipe 171 and a second pipe 172. The first pipe 171 corresponds to an inner pipe, and the second pipe 172 corresponds to an outer pipe. The first pipe 171 is open at both an upstream end 171A and a downstream end 171B.

Each of the first pipe 171 and the second pipe 172 may be a square pipe (see FIG. 9). The double pipe portion 170B in the present embodiment has a double square pipe structure, and a single pipe portion 170C has a single square pipe structure. Note that a single pipe is synonymous with a one-track pipe. Here, the square pipe structure is exemplified, but the opening 170A is not limited to the square pipe structure, and may be a circular pipe structure, and the upstream side of the circular pipe structure may be a double circular pipe.

The position where gas is blown out from the gas introduction member 170 is the boundary between the double square pipe and the single square pipe. That is, the position of a gas outlet 177 is the position of the downstream end 171B of the first pipe 171.

The gas outlet 177 is arranged so that L1 and L2 satisfy the following relationship, where L1 is the distance from a nozzle outlet position PNout of the nozzle hole 124 to the position where the droplets become the final droplet FD, and L2 is the distance from the nozzle outlet position PNout to a position PGout of the gas outlet 177.

$$L2 \geq L1$$

Here, L1 may be, for example, 30 mm or more and 350 mm or less. The dimension of L1 may be obtained in advance by experiment or the like.

The double pipe portion 170B is preferably long enough so that the direction of gas flow is parallel to the trajectory of the droplets. The length of the double pipe portion 170B may be, for example, 10 mm. The length of the double pipe portion 170B may be designed to be 10 mm or more.

The material of the gas introduction member 170 may be stainless steel, aluminum, or the like. The material of the first pipe 171 and the second pipe 172 configuring the opening 170A is preferably a material having low reactivity with the target substance. When the target substance is tin, any one of Mo, W, Ta, $Al_2O_3$, SiC, and $SiO_2$ is preferably used as the material of the first pipe 171 and the second pipe 172. Further, the surface of stainless steel or aluminum may be coated with the material that is less likely to react with the target substance.

The gas introduction member 170 includes a first shielding member 174 extending to the outer side of the first pipe 171 and a second shielding member 175 extending to the outer side of the second pipe 172. The first shielding member 174 is connected to the upstream end 171A of the first pipe 171 and covers between the first pipe 171 and the inner wall of the first container 16A. The first pipe 171 and the first shielding member 174 may be integrally configured as a single member, or may be configured by connecting separately-configured members.

The second shielding member 175 is connected to the upstream end 172A of the second pipe 172 and covers between the second pipe 172 and the inner wall of the first container 16A. The second pipe 172 and the second shielding member 175 may be integrally configured as a single member, or may be configured by connecting separately-configured members.

A gap serving as a gas introduction space 176 is formed between the first shielding member 174 and the second shielding member 175.

The gas introduction member 170 is connected to a gas supply source 182 through a pipe line 180. The pipe line 180 penetrates the wall of the first container 16A and communicates with the gas introduction space 176 of the gas introduction member 170. A flow rate adjuster 184 may be arranged between the gas introduction member 170 and the gas supply source 182. The gas supplied from the gas supply source 182 to the gas introduction member 170 may be, for example, hydrogen gas. The gas supply source 182 may be, for example, a hydrogen gas supply source including a hydrogen gas cylinder.

4.2 Operation

The flow rate adjuster 184 controls the gas supplied from the gas supply source 182 to a predetermined flow rate and supplies the gas to the gas introduction member 170. The gas is introduced into the gas introduction space 176 of the gas introduction member 170 from the chamber wall through the pipe line 180. The flow velocity of the gas from the gas outlet 177 is higher than the velocity of the droplet. The predetermined flow rate may be, for example, 10 SLM (Standard Litter/Min) or more.

The gas introduced into the gas introduction member 170 is supplied from the gas introduction space 176 to the gap 173 between the first pipe 171 and the second pipe 172. The gas flowing through the gap 173 in the double pipe portion 170B flows out from the gas outlet 177 opened in the downstream end 171B of the first pipe 171 into the second pipe 172 as flow parallel to the droplet trajectory direction. In this way, the gas blown out from the gas outlet 177 is introduced into the chamber 16 from the second pipe 172 through the double pipe portion 170B as flow parallel to the travel direction of the droplet 122.

The jet of the target substance output from the nozzle 126 is divided into the minute droplets MD and then combined to the final droplet FD.

The droplet after being combined to the final droplet FD is accelerated by the gas flow blown out from the gas outlet 177. The gas flow velocity is higher than that of the final droplet FD, and the acceleration increases as the velocity difference increases.

Figure 10:
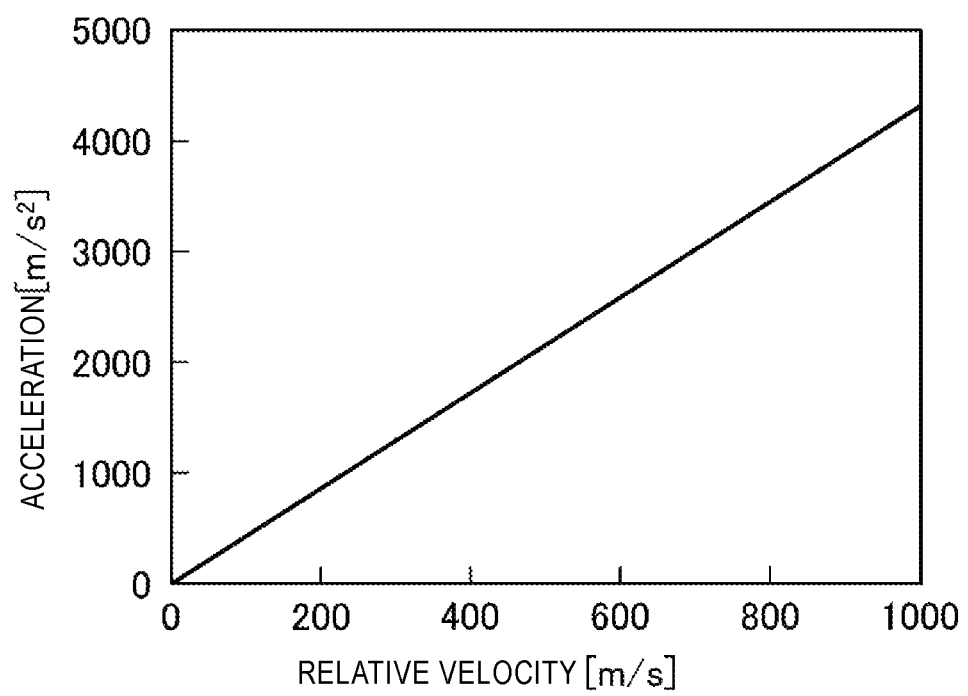
FIG. 10 is a graph showing the relationship between the relative velocity of the gas flow velocity with respect to the droplet and the acceleration applied to the droplet.

FIG. 10 is a graph showing the relationship between the relative velocity of the gas flow velocity with respect to the droplet and the acceleration applied to the droplet. The relative velocity is defined by the following expression.

Relative velocity=gas flow velocity−droplet velocity

The expression for calculating a drag force F acting on the droplet is expressed by the following expression (1).

$$F=PL^2V(2RT)^{-1/2}h_A(k) \quad (1)$$

where P is gas pressure, L is droplet radius, V is relative velocity between droplet and gas, R is gas constant, T is gas temperature, and $h_A(k)$ is constant. To calculate the drag force F acting on the final droplet FD, the values of the final droplet FD are used for L and V.

Assuming that the mass of the droplet is M, the acceleration is F/M. For example, when the velocity of the droplet until the gas acceleration is started is 100 m/s and the velocity of the gas is 1000 m/s, the relative velocity is 900 m/s. The acceleration in this case is 3890 m/s$^2$ from the graph of FIG. 10. Thus, the velocity of the droplet at the position 300 mm below the gas outlet 177 in the Y-axis direction is accelerated to 111 m/s.

The gas introduction member 170, the first pipe 171, and the second pipe 172 function as a gas flow generation device for causing the gas to flow along the droplet travel direction around a part of the trajectory of the final droplet FD, and function as a droplet acceleration device for accelerating the droplet by the gas flow. The gas introduction member 170, the first pipe 171, and the second pipe 172 are an example of the "gas flow generation device" in the present disclosure. At least one of the flow rate adjuster 184 and the pipe line 180 may be included in an example of the "gas flow generation device" in the present disclosure. The upstream end 171A of the first pipe 171 is an example of the "first end" in the present disclosure. The downstream end 171B of the first pipe 171 is an example of the "second end" in the present disclosure. The downstream end 172B of the second pipe 172 is an example of the "third end" in the present disclosure. The final droplet FD is an example of the "first droplet" in the present disclosure. The minute droplet MD is an example of the "second droplet" in the present disclosure.

4.3 Effect

According to the EUV light generation apparatus 12A of the first embodiment, the final droplet FD after being combined can be accelerated without disturbing the velocity or the travel direction of the minute droplet MD before being combined. This makes it possible to increase the distance between the adjacent final droplets FD while suppressing defects such as the uncombined droplets.

5. Second Embodiment

5.1 Configuration

Figure 11:
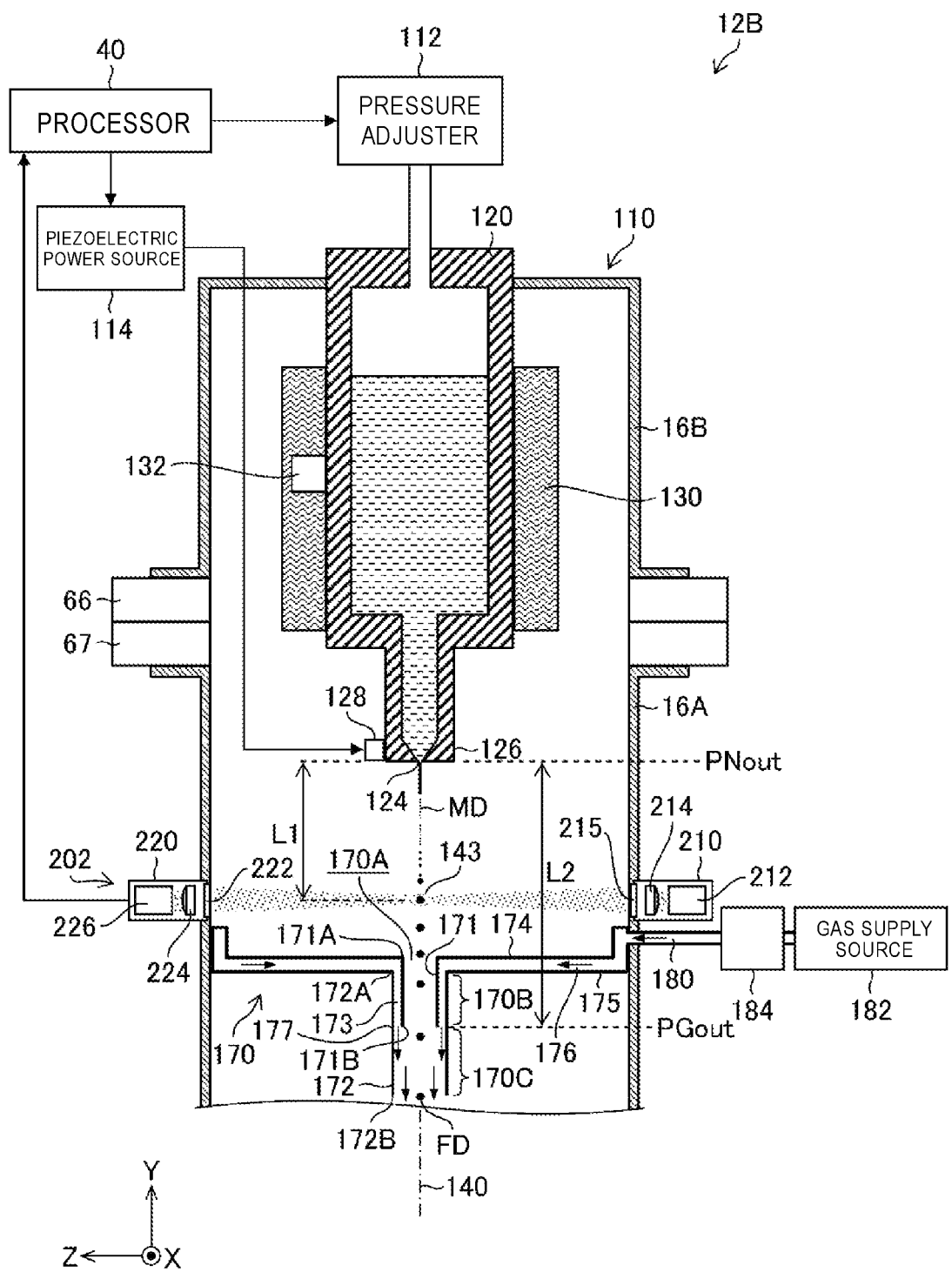
FIG. 11 schematically shows the configuration in the vicinity of the droplet generator in the EUV light generation apparatus according to a second embodiment.

FIG. 11 schematically shows the configuration in the vicinity of the droplet generator 110 in an EUV light generation apparatus 12B according to a second embodiment. The configuration shown in FIG. 11 will be described in terms of differences from the configuration shown in FIG. 8.

In the EUV light generation apparatus 12B shown in FIG. 11, a timing sensor 202 similar to the timing sensor 80 shown in FIG. 2 is arranged in the region between L1 and L2 to measure the combined state of the droplets. FIG. 11 shows an example in which the timing sensor 202 is arranged to measure the combined state of the target at the position of L1. Other configurations may be similar to those in FIGS. 2 and 8.

The timing sensor 202 includes a light source unit 210 and a light receiving unit 220. The light source unit 210 and the light receiving unit 220 are arranged so as to face each other across the droplet trajectory 140.

The light source unit 210 includes a light source 212 and an illumination optical system 214. The light source unit 210 is arranged so as to illuminate the droplet in the detection region 143 on the droplet trajectory 140. The detection region 143 may be located closer to the nozzle hole 124 than the detection region 142 described with reference to FIG. 1. The configurations of the light source 212 and the illumination optical system 214 may be similar to those of the light source 83 and the illumination optical system 84 described in FIG. 1. The illumination optical system 214 may include a window 215. The window 215 is arranged in the wall of the chamber 16.

The light receiving unit 220 includes a light receiving optical system 224 and an optical sensor 226. The light receiving unit 220 is arranged so as to receive illumination light that is at least a part of the illumination light output from the light source unit 210 and has passed through the detection region 143. The configurations of the light receiving optical system 224 and the optical sensor 226 may be similar to those of the light receiving optical system 86 and the optical sensor 87 described in FIG. 1. The light receiving optical system 224 may include a window 222. The window 222 is arranged in the wall of the chamber 16.

5.2 Operation

Figure 12:
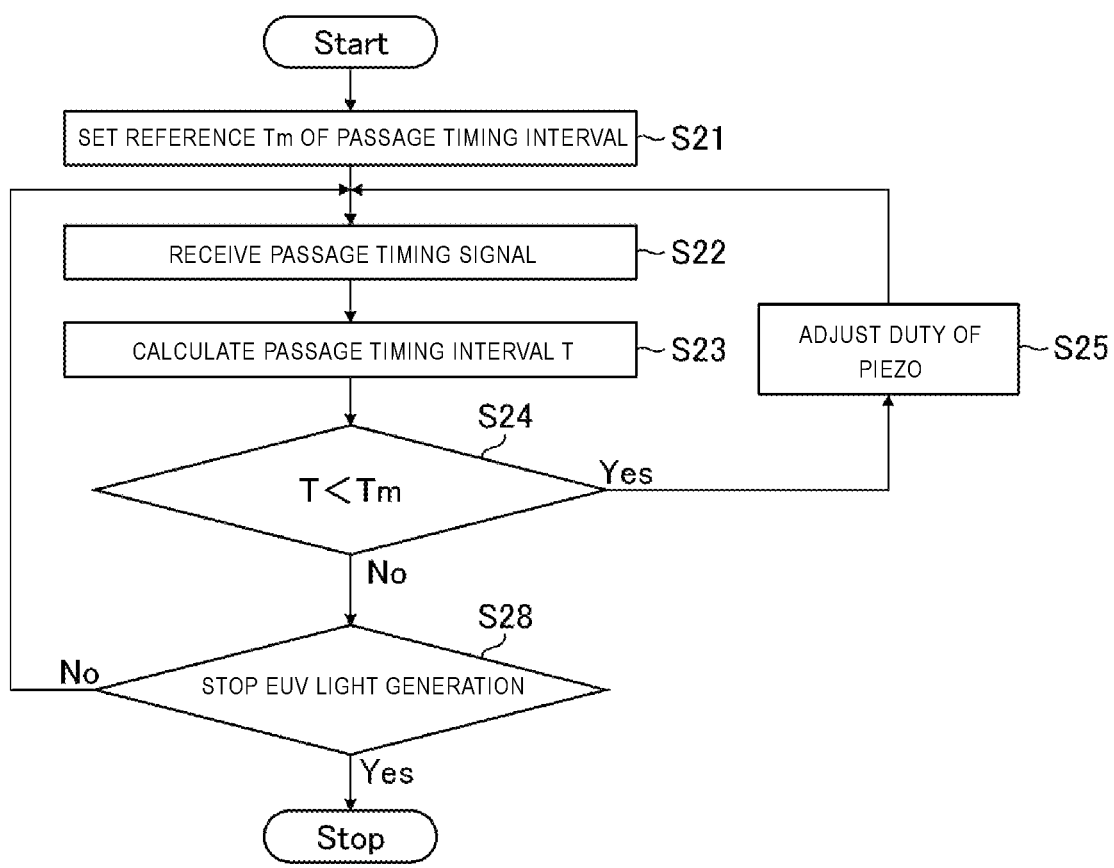
FIG. 12 is a flowchart showing an example of the operation of the EUV light generation apparatus.

FIG. 12 is a flowchart showing an example of the operation of the EUV light generation apparatus 12B. In step S21, the processor 40 sets a reference (lower limit value) Tm of the interval of the passage timing signals T(n). Here, Tm may be determined based on the cycle of the pulse laser light radiated to the droplet. Further, Tm may be stored in a storage device (not shown) or may be input by an operator.

Then, in step S22, the processor 40 receives the passage timing signal T(n) from the timing sensor 202. T(n) is the n-th passage timing signal.

Next, in step S23, the processor 40 calculates the passage timing interval T from the following expression.

$$T=T(n)-T(n-1)$$

Figure 13:
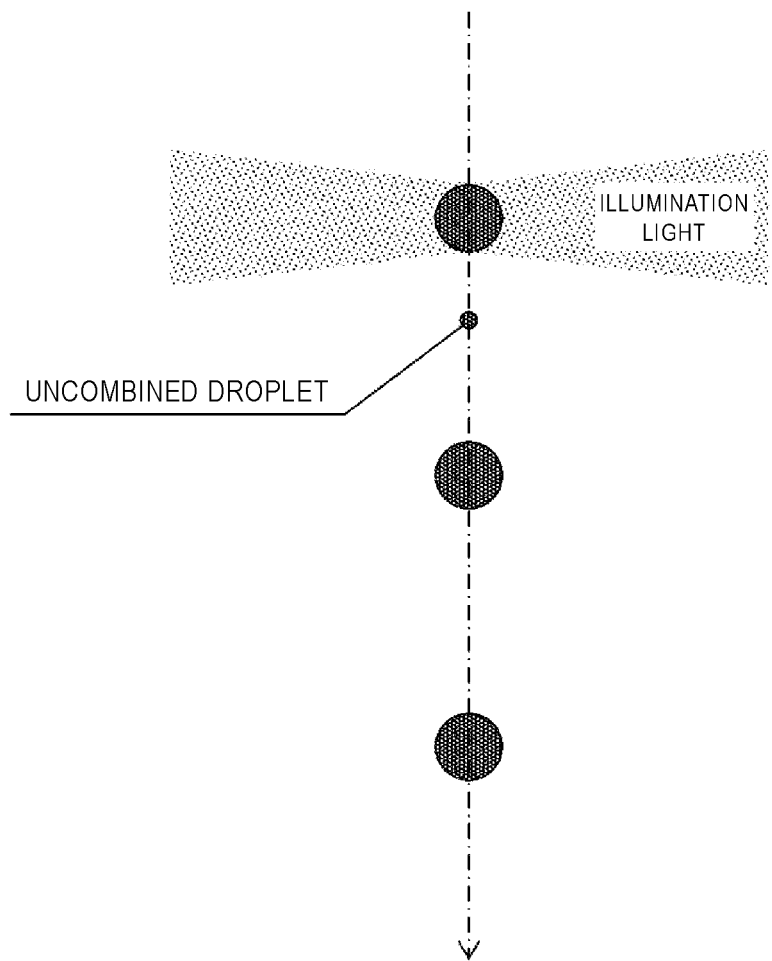
FIG. 13 is a schematic diagram showing an example of a case where there is an uncombined droplet.
Figure 14:
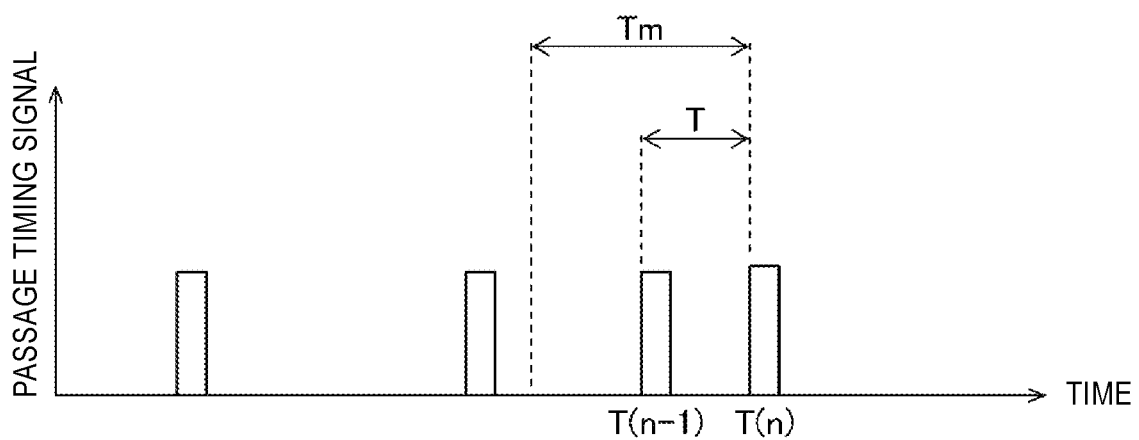
FIG. 14 is a waveform diagram showing an example of a passage timing signal obtained when an uncombined droplet is generated.
Figure 15:
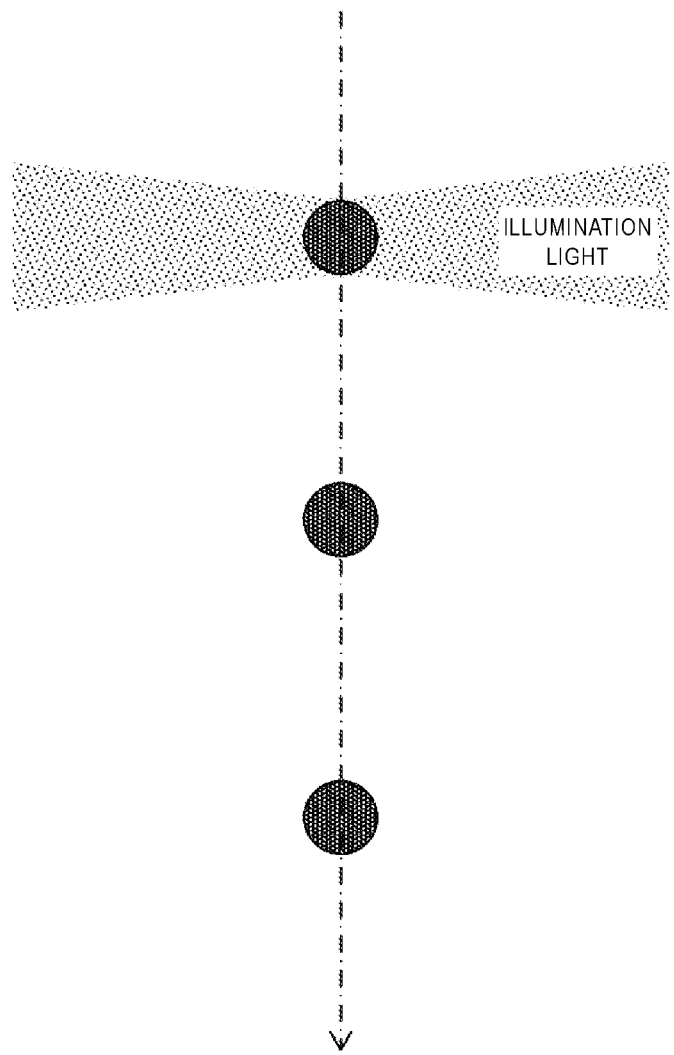
FIG. 15 is a schematic diagram showing an example of a case where there is no uncombined droplet.
Figure 16:
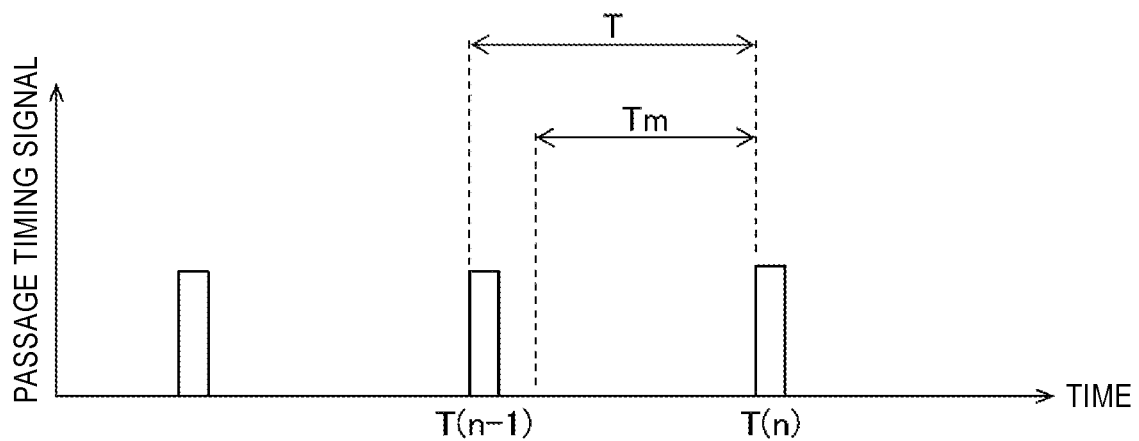
FIG. 16 is a waveform diagram showing an example of a passage timing signal obtained when no uncombined droplet is generated.

Then, in step S24, the processor 40 compares T with Tm to determine whether T is smaller than Tm. As shown in FIGS. 13 and 14, when there is an uncombined droplet, T<Tm is satisfied. On the other hand, as shown in FIGS. 15 and 16, when there is no uncombined droplet, T≥Tm is satisfied. That is, the processor 40 may determine that there is an uncombined droplet if T<Tm is satisfied, and otherwise (T≥Tm), the processor 40 may determine that there is no uncombined droplet. The determination in step S24 may be performed based on the passage timing signal T(n) from the timing sensor 80.

When the determination result of step S24 in FIG. 12 is Yes, the processor 40 proceeds to step S25. In step S25, the processor 40 adjusts the duty of the voltage applied to the piezoelectric element 128 so as not to generate an uncombined droplet. The processor 40 may adjust the pressure applied to the tank 120 of the droplet generator 110 instead of or in addition to adjusting the duty. After step S25, the processor 40 returns to step S22.

When the determination result of step S24 in FIG. 12 is No, the processor 40 proceeds to step S28. In step S28, the processor 40 checks whether there is an instruction to stop the EUV light generation. When there is no instruction to stop the EUV light generation and the determination result of step S28 is No, the processor 40 returns to step S22. On the other hand, when there is an instruction to stop the EUV light generation and the determination result of step S28 is Yes, the processor 40 ends the flowchart of FIG. 12.

The state in which there is an uncombined droplet shown in FIGS. 13 and 14 is an example of "combining failure" in the present disclosure. The passage timing interval T reflects the presence or absence of an uncombined droplet, that is, the combined state of droplets. The timing sensor 202 is an example of the "sensor for measuring the combined state of the first droplet" in the present disclosure.

5.3 Effect

According to the EUV light generation apparatus 12B of the second embodiment, when L1 becomes long due to temperature change and the like of the piezoelectric element 128, the nozzle 126, and the target substance during operation and the expression (1) is no longer satisfied, the duty of the voltage applied to the piezoelectric element 128 can be adjusted so that L1 satisfies the expression (1).

According to the second embodiment, the final droplet FD can be accelerated without disturbing the velocity or travel direction of the minute droplet MD before being combined. This makes it possible to increase the distance between the adjacent final droplets FD while suppressing defects such as the uncombined droplets.

6. Third Embodiment

6.1 Configuration

Figure 17:
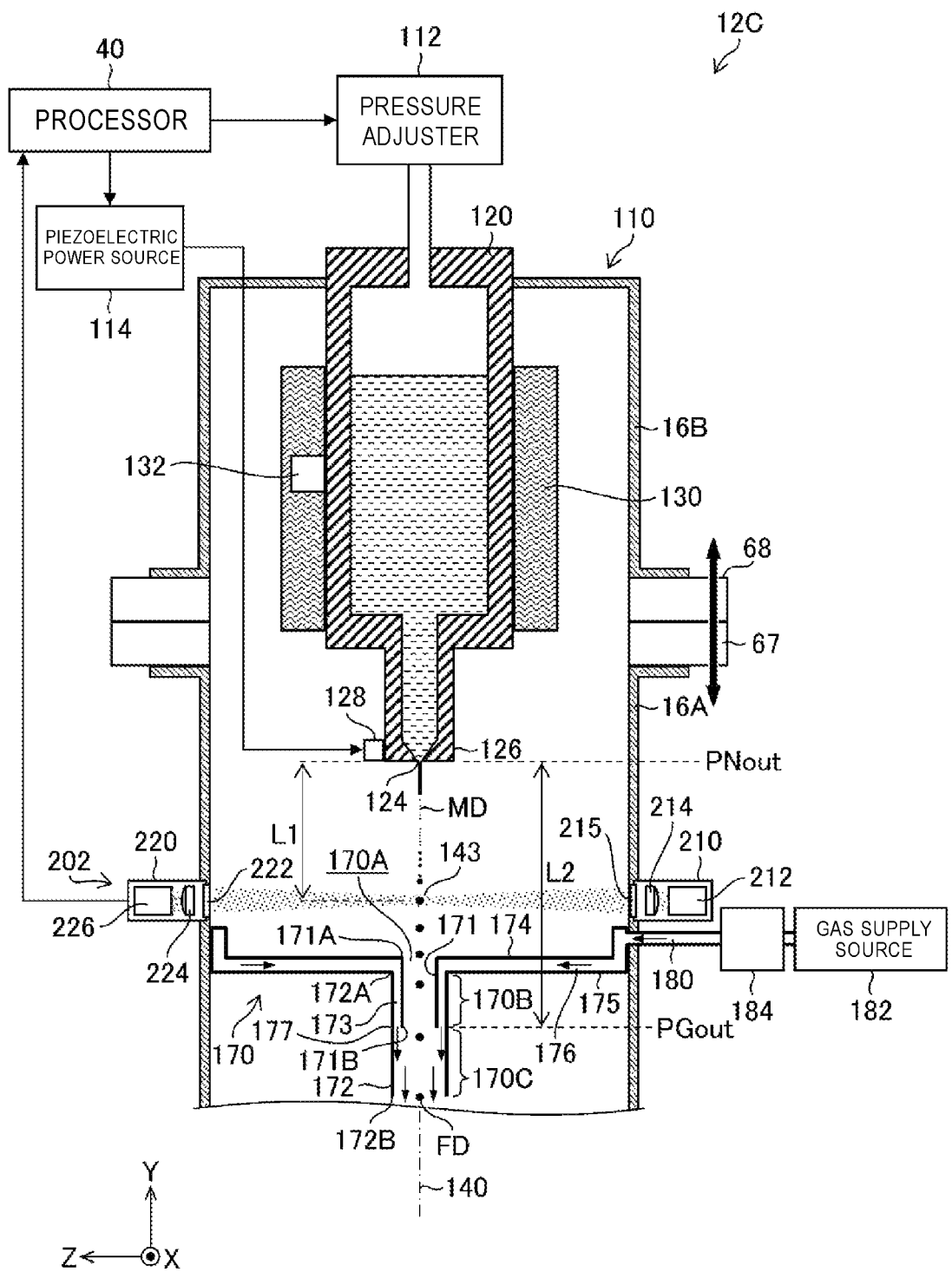
FIG. 17 schematically shows the configuration in the vicinity of the droplet generator in the EUV light generation apparatus according to a third embodiment.

FIG. 17 schematically shows an exemplary configuration in the vicinity of the droplet generator 110 in an EUV light generation apparatus 12C according to a third embodiment. The configuration shown in FIG. 17 will be described in terms of differences from the configuration shown in FIG. 11. The EUV light generation apparatus 12C shown in FIG. 17 includes a three axis stage 68 instead of the two axis stage 66 shown in FIG. 11. That is, the stage 66 in FIG. 11 is a stage movable in two directions of the X-axis direction and the Z-axis direction, whereas the stage 68 in FIG. 17 is a stage movable in three directions of the X-axis direction, the Y-axis direction, and the Z-axis direction. The stage 68 is an example of the "stage" and the "second stage" in the present disclosure. Other configurations may be similar to those in FIG. 11.

6.2 Operation

Figure 18:
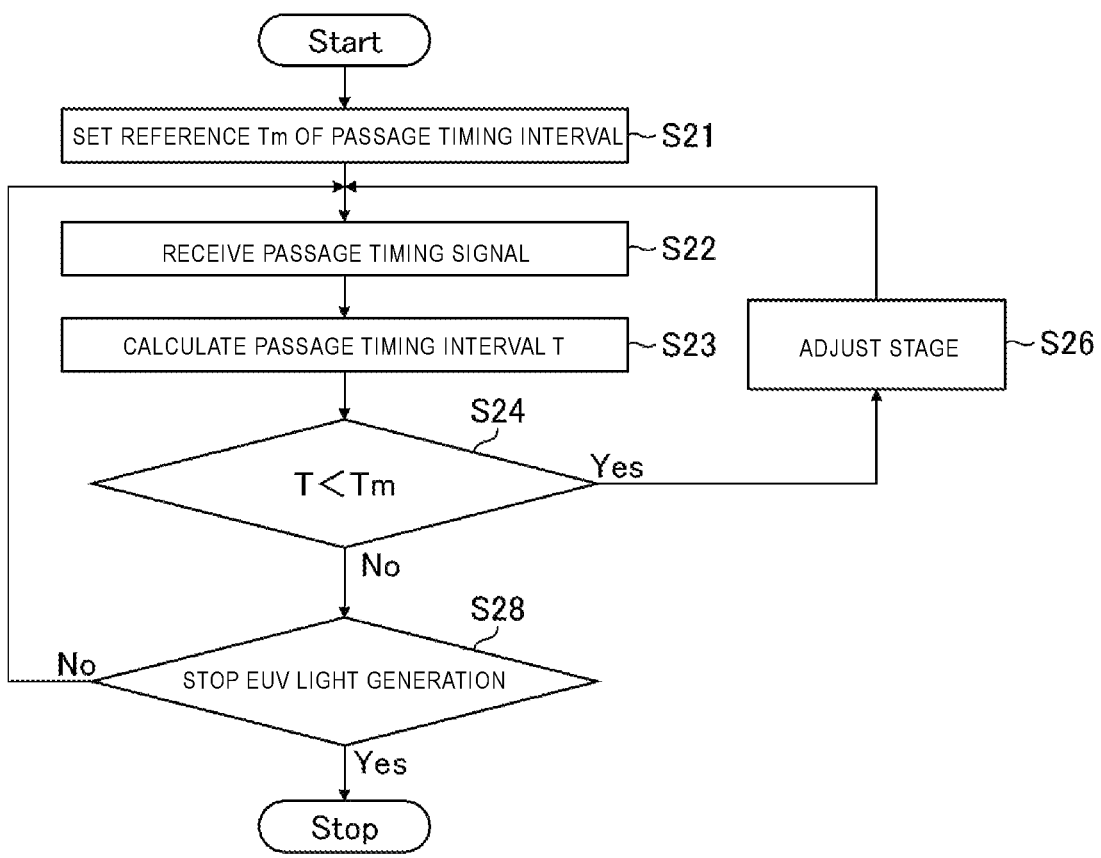
FIG. 18 is a flowchart showing an example of the operation of the EUV light generation apparatus according to the third embodiment.

FIG. 18 is a flowchart showing an example of the operation of the EUV light generation apparatus 12C according to the third embodiment. The flowchart shown in FIG. 18 will be described in terms of differences from that shown in FIG. 12.

The flowchart shown in FIG. 18 includes step S26 instead of step S25 in FIG. 12. Other steps may be similar to those in FIG. 12.

When the determination result of step S24 in FIG. 18 is Yes, the processor 40 proceeds to step S26. In step S26, the processor 40 performs control to adjust the stage 68 in the Y-axis direction and move the droplet generator 110 in the Y-axis direction so as not to generate an uncombined droplet. After step S26, the processor 40 returns to step S22.

6.3 Effect

According to the EUV light generation apparatus 12C of the third embodiment, when L1 becomes long due to temperature change and the like of the piezoelectric element 128, the nozzle 126, and the target substance during operation and the expression (1) is no longer satisfied, the stage 68 is controlled so that L1 satisfies the expression (1).

According to the third embodiment, the final droplet FD can be accelerated without disturbing the velocity or travel direction of the minute droplet MD before being combined. This makes it possible to increase the distance between the adjacent final droplets FD while suppressing defects such as the uncombined droplets.

7. Fourth Embodiment

7.1 Configuration

Figure 19:
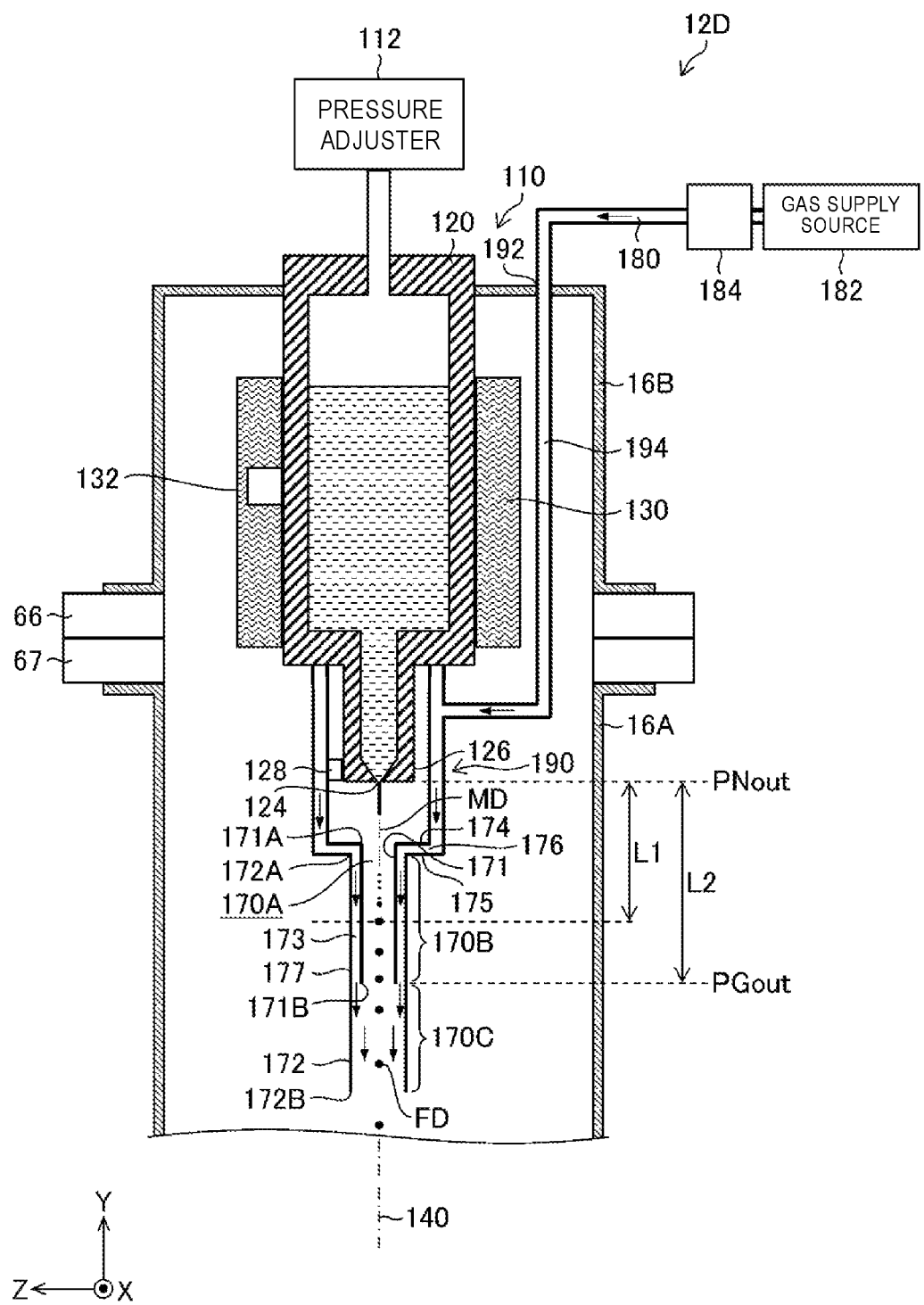
FIG. 19 schematically shows the configuration in the vicinity of the droplet generator in the EUV light generation apparatus according to a fourth embodiment.

FIG. 19 schematically shows the configuration in the vicinity of the droplet generator 110 in an EUV light generation apparatus 12D according to a fourth embodiment. The configuration shown in FIG. 19 will be described in terms of differences from the configuration shown in FIG. 12. The EUV light generation apparatus 12D shown in FIG.

19 includes a gas introduction member 190 instead of the gas introduction member 170 shown in FIG. 12, and the gas introduction member 190 is fixed to the droplet generator 110. The flow path structure of the gas introduction member 190 may be similar to that of the gas introduction member 170 of FIG. 12. In FIG. 19, elements corresponding to those of the gas introduction member 170 of FIG. 12 are denoted by the same reference numerals, and description thereof will be omitted.

In the EUV light generation apparatus 12D, an inlet 192 for introducing gas into the chamber 16 is arranged in the wall of the second container 16B to which the droplet generator 110 is fixed. The gas introduction member 190 is connected to the flow rate adjuster 184 through a pipe 194 communicating with the inlet 192. Adopting the configuration shown in FIG. 19 facilitates connection and disconnection of the gas pipe during installation and removal of the droplet generator 110.

7.2 Operation

The operation of the EUV light generation apparatus 12D may be similar to that of the EUV light generation apparatus 12A according to the first embodiment.

7.3 Effect

According to the EUV light generation apparatus 12D of the fourth embodiment, even if the stage 66 is moved in the direction parallel to the X-Z plane, the trajectory of the droplet comes to the center of the gas flow. Therefore, the droplet can be accelerated without applying an asymmetric force to the droplet. According to the fourth embodiment, the final droplet FD can be accelerated without disturbing the velocity or travel direction of the minute droplet MD before being combined. This makes it possible to increase the distance between the adjacent final droplets FD while suppressing defects such as the uncombined droplets.

7.4 Modified Example

The configuration of the gas introduction member 190 described in the fourth embodiment can be combined with the configuration of the second or third embodiment.

8. Example of Electronic Device Manufacturing Method

Figure 20:
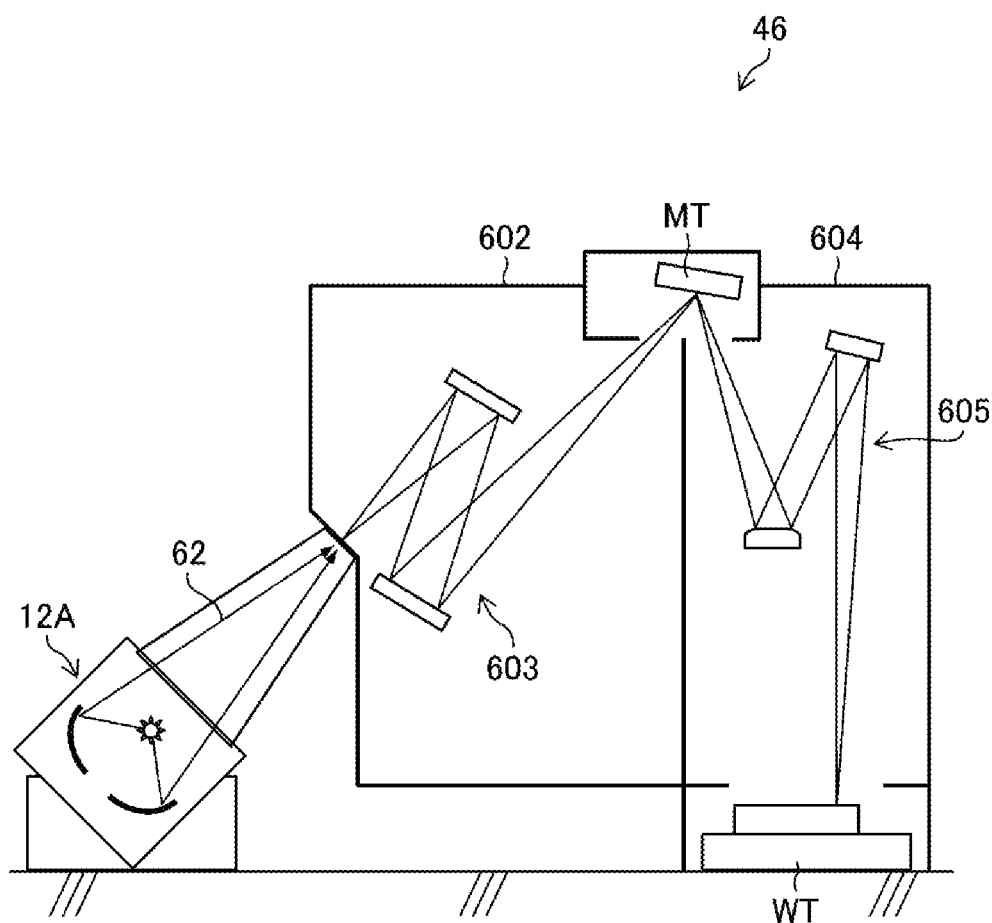
FIG. 20 schematically shows the configuration of an exposure apparatus connected to the EUV light generation apparatus.

FIG. 20 schematically shows the configuration of the exposure apparatus 46 connected to the EUV light generation apparatus 12A. The exposure apparatus 46 includes a mask irradiation unit 602 and a workpiece irradiation unit 604. The mask irradiation unit 602 illuminates, through a reflection optical system 603, a mask pattern of a mask (not shown) arranged on a mask table MT with the EUV light 62 incident from the EUV light generation apparatus 12A. The workpiece irradiation unit 604 images the EUV light 62 reflected by the mask table MT onto a workpiece (not shown) arranged on the workpiece table WT through a reflection optical system 605. The workpiece is a photosensitive substrate such as a semiconductor wafer on which photoresist is applied.

The exposure apparatus 46 synchronously translates the mask table MT and the workpiece table WT to expose the workpiece to the EUV light 62 reflecting the mask pattern. After the mask pattern is transferred onto the semiconductor wafer by the exposure process described above, a semiconductor device can be manufactured through a plurality of processes. The semiconductor device is an example of the "electronic device" in the present disclosure. Instead of the EUV light generation apparatus 12A, the EUV light generation apparatus 12B, 12C, 12D, or the like may be used.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation apparatus, comprising:
    a chamber configured to generate plasma therein;
    a droplet generator configured to contain a target substance and to sequentially supply a first droplet of target substance to a plasma generation region in the chamber; and
    a gas flow generation device having a gas outlet for causing gas to flow along a travel direction of the first droplet around at least a part of a trajectory of the first droplet,
    the chamber including a first container, a second container communicating with the first container, and a first stage which supports the second container to be movable with respect to the first container,
    the gas flow generation device including:
        a first pipe which covers at least a part of the trajectory of the first droplet, and is open at both a first end being an upstream end and a second end being a downstream end in the trajectory direction of the first droplet;
        a second pipe which covers at least a part of the first pipe and arranged with a gap with respect to the at least part of the first pipe and is open at a third end being a downstream end in the trajectory direction among both ends of the second pipe, the third end being located further downstream of the second end of the first pipe in the trajectory direction; and
        a gas introduction member configured to supply gas to the gap between the first pipe and the second pipe to cause the gas to flow out in the trajectory direction from the gas outlet opened on the second end side of the gap,
    the droplet generator including a vibrating element configured to generate, by applying vibration to a nozzle through which the target substance is output, a plurality of second droplets each having smaller volume than the first droplet and to cause the second droplets to be combined to generate the first droplet, the first container and the second container being connected through the first stage, the droplet generator and the gas introduction member being fixed to the second container, and the gas outlet being located downstream, on a trajectory direction of the first droplet, of a position where the second droplets are combined and the first droplet is generated.

2. The extreme ultraviolet light generation apparatus according to claim 1, wherein a distance from an outlet of the nozzle to a position where the second droplets are combined to generate the first droplet is 30 mm or more and 350 mm or less.

3. The extreme ultraviolet light generation apparatus according to claim 1, wherein each of the first pipe and the second pipe is a square pipe or a circular pipe.

4. The extreme ultraviolet light generation apparatus according to claim 1, wherein the gas introduction member is fixed to an inner wall of the chamber.

5. The extreme ultraviolet light generation apparatus according to claim 1, wherein a length of a double pipe portion in which the first pipe is covered by the second pipe is 10 mm or more.

6. The extreme ultraviolet light generation apparatus according to claim 1, further comprising a sensor configured to measure a combined state of the first droplet.

7. The extreme ultraviolet light generation apparatus according to claim 6, wherein the sensor is arranged at a position to measure the combined state between a position where the first droplet is generated and the position of the gas outlet in the trajectory direction.

8. The extreme ultraviolet light generation apparatus according to claim 6, further comprising a processor configured to adjust a duty of a voltage applied to the vibrating element when a combining failure is detected by the sensor.

9. The extreme ultraviolet light generation apparatus according to claim 6, further comprising a processor configured to adjust a pressure in a tank containing the target substance of the droplet generator when a combining failure is detected by the sensor.

10. The extreme ultraviolet light generation apparatus according to claim 6, further comprising a second stage configured to move the droplet generator in the trajectory direction, and a processor configured to adjust the second stage when a combining failure is detected by the sensor.

11. The extreme ultraviolet light generation apparatus according to claim 1, wherein the first pipe and the second pipe are fixed to the droplet generator.

12. The extreme ultraviolet light generation apparatus according to claim 1, wherein gas flow velocity of the gas blown out from the gas outlet is higher than velocity of the first droplet, and the gas flow generation device accelerates the first droplet by the gas flow.

13. The extreme ultraviolet light generation apparatus according to claim 1, wherein the number of the second droplets to be combined to generate the first droplet is 5 or more and 70 or less.

14. The extreme ultraviolet light generation apparatus according to claim 1, wherein a voltage waveform applied to the vibrating element is an amplitude modulation wave or a rectangular wave.

15. The extreme ultraviolet light generation apparatus according to claim 1, wherein the gas is hydrogen gas.

16. An electronic device manufacturing method, comprising:

generating extreme ultraviolet light using an extreme ultraviolet light generation apparatus;

emitting the extreme ultraviolet light to an exposure apparatus; and exposing a photosensitive substrate to the extreme ultraviolet light in the exposure apparatus to manufacture an electronic device, the extreme ultraviolet light generation apparatus including a chamber configured to generate plasma therein, the chamber including a first container, a second container communicating with the first container, and a first stage which supports the second container to be movable with respect to the first container, the first container and the second container being connected through the first stage;

a droplet generator configured to contain a target substance and to sequentially supply a first droplet of target substance to a plasma generation region in the chamber; and a gas flow generation device having a gas outlet for causing gas to flow along a travel direction of the first droplet around at least a part of a trajectory of the first droplet, the gas flow generation device including:

a first pipe which covers at least a part of the trajectory of the first droplet, and is open at both a first end, being an upstream end, and a second end, being a downstream end, in the trajectory direction of the first droplet;

a second pipe which covers at least a part of the first pipe and arranged with a gap with respect to the at least part of the first pipe and is open at a third end, being a downstream end in the trajectory direction among both ends of the second pipe, the third end being located further downstream of the second end of the first pipe in the trajectory direction; and a gas introduction member configured to supply gas to the gap between the first pipe and the second pipe to cause the gas to flow out in the trajectory direction from the gas outlet opened on the second end side of the gap, the droplet generator including a vibrating element configured to generate, by applying vibration to a nozzle through which the target substance is output, a plurality of second droplets each having smaller volume than the first droplet and to cause the second droplets to be combined to generate the first droplet, the droplet generator and the gas introduction member being fixed to the second container, and the gas outlet being located downstream, on a trajectory direction of the first droplet, of a position where the second droplets are combined and the first droplet is generated.

* * * * *